United States Patent
Kim et al.

(10) Patent No.: US 11,968,903 B2
(45) Date of Patent: Apr. 23, 2024

(54) PIEZOELECTRIC ELEMENT FOR SPEAKER AND MANUFACTURING METHOD THEREFOR

(71) Applicant: SAMSUNG ELECTRONICS CO., LTD., Suwon-si (KR)

(72) Inventors: Jisun Kim, Suwon-si (KR); Taeyoung Kim, Suwon-si (KR); Joungkook Seo, Suwon-si (KR); Sanghoon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 16/957,829

(22) PCT Filed: Dec. 18, 2018

(86) PCT No.: PCT/KR2018/016075
§ 371 (c)(1),
(2) Date: Jun. 25, 2020

(87) PCT Pub. No.: WO2019/132368
PCT Pub. Date: Jul. 4, 2019

(65) Prior Publication Data
US 2021/0376220 A1     Dec. 2, 2021

(30) Foreign Application Priority Data
Dec. 29, 2017   (KR) ........................ 10-2017-0184627

(51) Int. Cl.
*H10N 30/50*      (2023.01)
*H04R 3/12*      (2006.01)
(Continued)

(52) U.S. Cl.
CPC ............... *H10N 30/50* (2023.02); *H04R 3/12* (2013.01); *H04R 17/00* (2013.01); *H10N 30/05* (2023.02);
(Continued)

(58) Field of Classification Search
CPC ..... H01L 41/083; H01L 41/0472; H04R 3/12; H04R 17/00; H10N 30/50; H10N 30/05;
(Continued)

(56) References Cited

U.S. PATENT DOCUMENTS

| 6,912,288 B2 | 6/2005 | Nakashima et al. |
| 2003/0007651 A1 | 1/2003 | Nakashima et al. |

(Continued)

FOREIGN PATENT DOCUMENTS

| CN | 1395404 A | 2/2003 |
| CN | 101686423 A | 3/2010 |

(Continued)

OTHER PUBLICATIONS

Communication dated Jul. 5, 2021 issued by the Indian Patent Office in counterpart Indian Application No. 202017027562.
(Continued)

*Primary Examiner* — Matthew L Reames
(74) *Attorney, Agent, or Firm* — Sughrue Mion, PLLC

(57) ABSTRACT

Provided are a piezoelectric element for a speaker and a method of manufacturing the same. The piezoelectric element for a speaker includes a plurality of piezoelectric ceramic layers stacked on one another in a thickness direction, and a plurality of electrodes provided to be connected to middle portions of sides of the plurality of piezoelectric ceramic layers along external walls of the plurality of stacked piezoelectric ceramic layers, wherein middle portions of some sides from among a plurality of sides of each of the plurality of piezoelectric ceramic layers are etched,
(Continued)

and wherein the plurality of piezoelectric ceramic layers are stacked on one another in the thickness direction not to overlap non-etched sides from among the plurality of sides.

12 Claims, 10 Drawing Sheets

(51) Int. Cl.
    *H04R 17/00*     (2006.01)
    *H10N 30/05*     (2023.01)
    *H10N 30/082*     (2023.01)
    *H10N 30/853*     (2023.01)
    *H10N 30/87*     (2023.01)

(52) U.S. Cl.
    CPC ......... *H10N 30/082* (2023.02); *H10N 30/853* (2023.02); *H10N 30/872* (2023.02)

(58) Field of Classification Search
    CPC ... H10N 30/082; H10N 30/853; H10N 30/872
    See application file for complete search history.

(56) References Cited

U.S. PATENT DOCUMENTS

| | | | |
|---|---|---|---|
| 2004/0201326 A1 | 10/2004 | Yokoi et al. | |
| 2004/0205949 A1 | 10/2004 | Takeshima et al. | |
| 2011/0182450 A1 | 7/2011 | Chung et al. | |
| 2016/0351789 A1 | 12/2016 | Watanabe et al. | |
| 2017/0263845 A1 | 9/2017 | Hatano et al. | |
| 2017/0363409 A1* | 12/2017 | Genmei | H01L 41/047 |

FOREIGN PATENT DOCUMENTS

| | | |
|---|---|---|
| CN | 107180911 A | 9/2017 |
| CN | 107208999 A | 9/2017 |
| EP | 1 357 768 A2 | 10/2003 |
| JP | 2006-188414 A | 7/2006 |
| JP | 2014-068141 A | 4/2014 |
| KR | 10-0482992 B1 | 4/2005 |
| KR | 10-0807316 B1 | 2/2008 |
| KR | 10-1439315 B1 | 9/2014 |
| KR | 10-1577961 B1 | 12/2015 |
| KR | 10-2016-0097749 A | 8/2016 |

OTHER PUBLICATIONS

International Search Report and Written Opinion (PCT/ISA/210 and PCT/ISA/237), dated Mar. 25, 2019 by International Searching Authority in International Application No. PCT/KR2018/016075.

Communication dated Nov. 23, 2020 issued by the European Intellectual Property Office in counterpart European Application No. 18893601.7.

Communication dated Mar. 8, 2023 by the China National Intellectual Property Administration for Chinese Patent Application No. 201880084835.6.

Communication dated Jul. 5, 2023, issued by the Korean Intellectual Property Office in counterpart Korean Patent Application No. 10-2017-0184627.

* cited by examiner

PIEZOELECTRIC ELEMENT FOR SPEAKER AND MANUFACTURING METHOD THEREFOR

TECHNICAL FIELD

The present disclosure relates to a piezoelectric element for a speaker and a method of manufacturing the same, and more particularly, to a piezoelectric element using a plurality of piezoelectric ceramic layers, and a method of manufacturing the same.

BACKGROUND ART

Because many of mobile devices such as cellular phones, smartphones, and laptops, and televisions (TVs) including liquid-crystal display (LCD) TVs and light-emitting diode (LED) TVs are currently provided in slim sizes, piezoelectric or ultrasonic speakers attract much attention as an alternative of conventional dynamic speakers using a magnet coil.

In general, the piezoelectric and ultrasonic speakers are thin and lightweight and consume low power compared to the conventional speakers, and thus, are regarded as future-leading speakers. However, despite the above advantages, the piezoelectric and ultrasonic speakers have low output sound pressure and poor low-frequency characteristics compared to the conventional dynamic speakers, and thus, may not be easily commercialized.

In addition, to reduce the size of directional speakers and to improve the performance of the directional speakers at low power, a piezoelectric element capable of effectively adjusting an input impedance by using a plurality of highly-efficient piezoelectric structures capable of achieving high sound pressure at low power needs to be developed.

DESCRIPTION OF EMBODIMENTS

Technical Problem

Provided are a piezoelectric element for a speaker, the piezoelectric element being capable of achieving a high capacitor value in a low-power environment, and a method of manufacturing the same.

Provided are a piezoelectric element capable of improving the quality of sound by freely transforming piezoelectric ceramic layers, and a method of manufacturing the same.

Provided are a piezoelectric element usable to produce speakers of various characteristics by adjusting an etching distance between non-etched portions of piezoelectric ceramic layers and electrodes in a manufacturing process of the piezoelectric element, and a method of manufacturing the same.

BEST MODE

Figure 1:
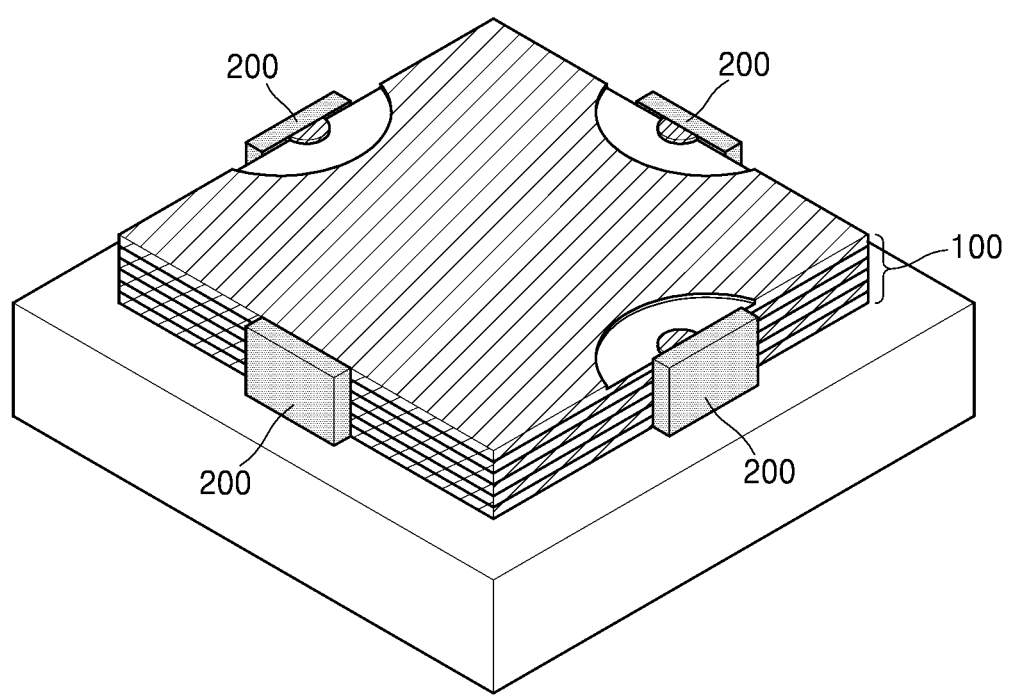
FIG. 1 is a view illustrating an example of a piezoelectric element for a speaker, according to an embodiment.

According to an aspect of the present disclosure, a piezoelectric element for a speaker includes a plurality of piezoelectric ceramic layers stacked on one another in a thickness direction, and a plurality of electrodes provided to be connected to middle portions of sides of the plurality of piezoelectric ceramic layers along external walls of the plurality of stacked piezoelectric ceramic layers, wherein middle portions of some sides from among a plurality of sides of each of the plurality of piezoelectric ceramic layers are etched, and wherein the plurality of piezoelectric ceramic layers are stacked on one another in the thickness direction not to overlap non-etched sides from among the plurality of sides.

According to another aspect of the present disclosure, a method of manufacturing a piezoelectric element for a speaker includes preparing a plurality of piezoelectric ceramic layers by etching middle portions of some sides from among a plurality of sides of each of the plurality of piezoelectric ceramic layers, stacking the plurality of prepared piezoelectric ceramic layers on one another in a thickness direction, and providing a plurality of electrodes to be connected to middle portions of sides of the plurality of piezoelectric ceramic layers along external walls of the plurality of stacked piezoelectric ceramic layers, wherein the plurality of piezoelectric ceramic layers are stacked on one another in the thickness direction not to overlap non-etched sides from among the plurality of sides.

MODE OF DISCLOSURE

Hereinafter, the disclosure will be described in detail by explaining embodiments of the disclosure with reference to the attached drawings. The disclosure may, however, be embodied in many different forms and should not be construed as being limited to the embodiments of the disclosure set forth herein. In the drawings, parts not related to the disclosure are not illustrated for clarity of explanation, and like reference numerals denote like elements.

It will be understood that when an element is referred to as being "connected to" another element, it may be "directly connected to" the other element or be "electrically connected to" the other element through an intervening element. It will be further understood that the terms "includes" and/or "including", when used herein, specify the presence of stated elements, but do not preclude the presence or addition of one or more other elements, unless the context clearly indicates otherwise.

Reference will now be made in detail to embodiments of the disclosure, examples of which are illustrated in the accompanying drawings.

FIG. 1 is a view illustrating an example of a piezoelectric element for a speaker, according to an embodiment.

Referring to FIG. 1, a piezoelectric element for a speaker, according to an embodiment, may include a plurality of stacked piezoelectric ceramic layers 100 and a plurality of electrodes 200. The plurality of piezoelectric ceramic layers 100 may be stacked on one another in a thickness direction, and the plurality of electrodes 200 may be provided to be connected to middle portions of sides of the plurality of piezoelectric ceramic layers 100 along external walls of the plurality of stacked piezoelectric ceramic layers 100. The plurality of electrodes 200 may be provided in close contact with the plurality of piezoelectric ceramic layers 100 along the external walls of the plurality of stacked piezoelectric ceramic layers 100. The plurality of electrodes 200 may be made of, for example, a metal conductor such as gold, silver, copper, or nickel, or conductive paint such as conductive epoxy or silver paste.

Middle portions of some sides from among a plurality of sides of each of the plurality of piezoelectric ceramic layers 100 may be etched, and the plurality of piezoelectric ceramic layers 100 may be stacked on one another in a thickness direction not to overlap non-etched sides from among the plurality of sides thereof.

As such, the piezoelectric element including a structure in which the plurality of piezoelectric ceramic layers 100 are stacked on one another may have a high capacitance at low power and be flexibly transformed by a voltage applied through an electrode.

Figure 2:
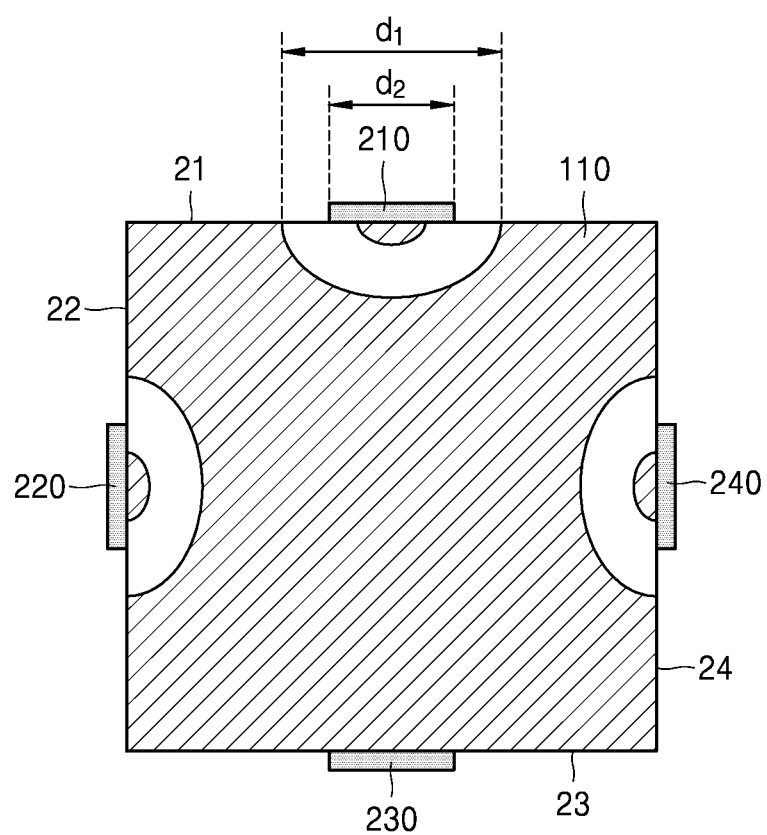
FIG. 2 is a view illustrating one of a plurality of stacked piezoelectric ceramic layers, and a plurality of electrodes, according to an embodiment.

FIG. 2 is a view illustrating one of a plurality of stacked piezoelectric ceramic layers, and a plurality of electrodes, according to an embodiment.

Referring to FIG. 2, middle portions of some sides from among a plurality of sides on a top surface of a piezoelectric ceramic layer 110 may be etched. For example, as illustrated in FIG. 2, the piezoelectric ceramic layer 110 may be produced in a rectangle shape and be processed in such a manner that middle portions of three sides from among four sides of the rectangle on the top surface of the piezoelectric ceramic layer 110 are etched.

For example, on the top surface of the piezoelectric ceramic layer 110, a middle portion of a first side 21, a middle portion of a second side 22, and a middle portion of a fourth side 24 may be etched and a middle portion of a third side 23 may not be etched. A first electrode 210, a second electrode 220, a third electrode 230, and a fourth electrode 240 may be respectively and closely connected to external walls corresponding to the sides of the top surface of the piezoelectric ceramic layer 110.

In addition, a conductive material located on the middle portions of the some sides from among the plurality of sides on the top surface of the piezoelectric ceramic layer 110 may be etched.

In this case, a width of the etched middle portions on the top surface of the piezoelectric ceramic layer 110 may be greater than a width of electrodes. For example, a width d1 of the etched middle portion of the first side 21 on the top surface of the piezoelectric ceramic layer 110 may be greater than a width d2 of the first electrode 210. As such, a voltage from an electrode may be applied to the piezoelectric ceramic layer 110 through a non-etched middle portion on the top surface of the piezoelectric ceramic layer 110.

Neighboring electrodes from among the plurality of electrodes may have the same polarity. For example, the first and second electrodes 210 and 220 may have a polarity of (+) and the third and fourth electrodes 230 and 240 may have a polarity of the ground.

The etched middle portions on the top surface of the piezoelectric ceramic layer 110 may have a half donut shape, as illustrated in FIG. 2, but are not limited thereto. For example, the shape of the etched middle portions on the top surface of the piezoelectric ceramic layer 110 may include at least one of a half circle shape, a half oval shape, and a half rectangle shape. The etched middle portions on the top surface of the piezoelectric ceramic layer 110 may be determined to have various shapes and sizes based on properties of a piezoelectric ceramic layer and desired characteristics of a piezoelectric element.

For example, a thinner piezoelectric ceramic layer may achieve higher sound pressure but manufacturing costs are increased to reduce the thickness of the piezoelectric ceramic layer. As such, when a piezoelectric element is manufactured according to an embodiment of the present disclosure, a high yield and sound pressure may be achieved using a piezoelectric ceramic layer having a thickness of about 30 μm.

In addition, a smaller etched area on a piezoelectric ceramic layer may achieve higher sound pressure but a distance greater than a certain value needs to be ensured between a non-etched portion and an electrode. When a piezoelectric element according to an embodiment is manufactured, a capacitance and an input impedance of a directional speaker may be adjusted by adjusting a distance between a non-etched portion and an electrode, and thus, a directional speaker having certain sound pressure characteristics may be manufactured.

Figure 3:
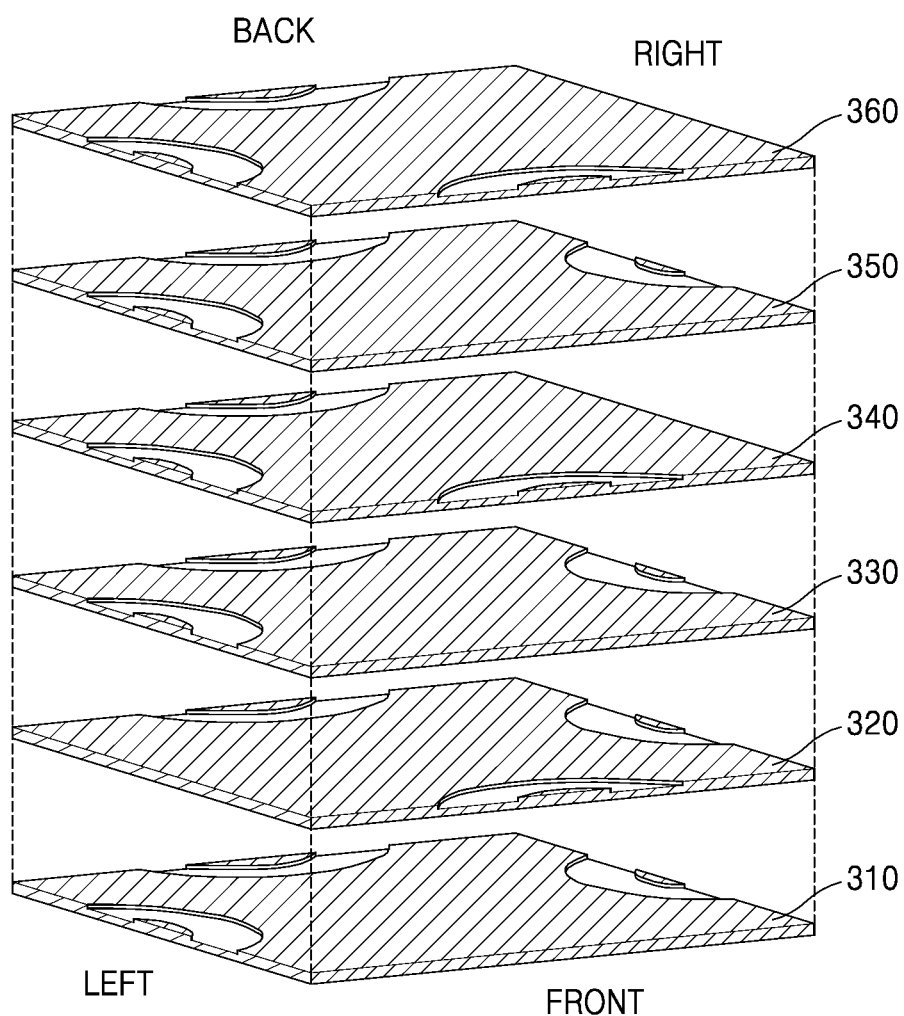
FIG. 3 is a view illustrating an example of stacking a plurality of piezoelectric ceramic layers on one another, according to an embodiment.

FIG. 3 is a view illustrating an example of stacking a plurality of piezoelectric ceramic layers on one another, according to an embodiment.

Referring to FIG. 3, a first piezoelectric ceramic layer 310, a second piezoelectric ceramic layer 320, a third piezoelectric ceramic layer 330, a fourth piezoelectric ceramic layer 340, a fifth piezoelectric ceramic layer 350, and a sixth piezoelectric ceramic layer 360 may be stacked on one another in a thickness direction.

Middle portions of three sides from among four sides of each of the first to sixth piezoelectric ceramic layers 310, 320, 330, 340, 350, and 360 may be etched, and a middle portion of one side from among the four sides may not be etched.

The first to sixth piezoelectric ceramic layers 310, 320, 330, 340, 350, and 360 may be stacked on one another not to overlap the non-etched middle portions thereof.

A pattern of stacking a plurality of piezoelectric ceramic layers on one another not to overlap non-etched middle portions thereof may be determined according to various criteria based on properties of piezoelectric ceramic layers and desired characteristics of a piezoelectric element.

For example, four to twelve piezoelectric ceramic layers may be stacked on one another and an input impedance may be differently adjusted depending on the number of stacked piezoelectric ceramic layers. For a directional speaker, based on an impedance of an audio amplifier in a case when about twenty piezoelectric elements are aligned in parallel, each piezoelectric element may include six piezoelectric ceramic layers but is not limited thereto.

In the plurality of stacked piezoelectric ceramic layers, the non-etched middle portion of the first piezoelectric ceramic layer 310 may face a front direction, the non-etched middle portion of the second piezoelectric ceramic layer 320 may face a left direction, the non-etched middle portion of the third piezoelectric ceramic layer 330 may face the front direction, the non-etched middle portion of the fourth piezoelectric ceramic layer 340 may face a right direction, the non-etched middle portion of the fifth piezoelectric ceramic layer 350 may face the front direction, and the non-etched middle portion of the sixth piezoelectric ceramic layer 360 may face the right direction.

Figure 4:
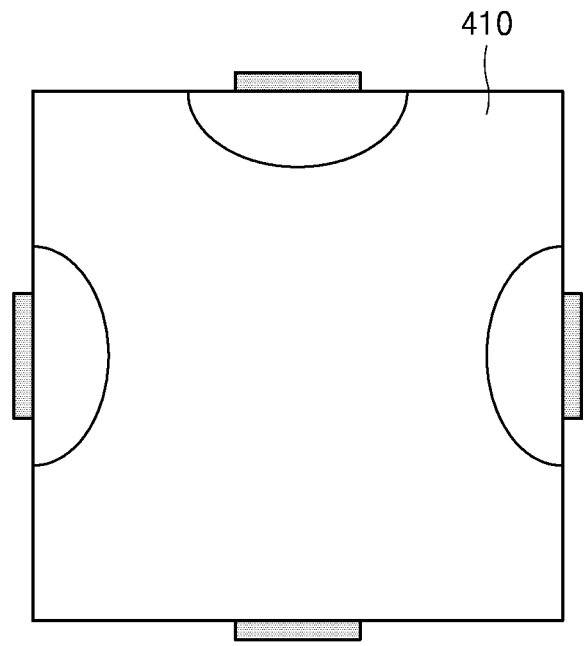
FIGS. 4 and 5 are views illustrating other examples of the shape of etched middle portions on a top surface of a piezoelectric ceramic layer, according to an embodiment.
Figure 5:
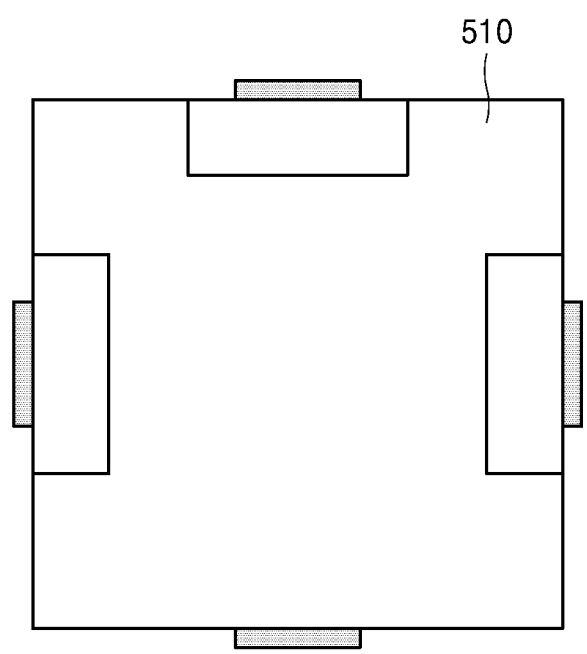

FIGS. 4 and 5 are views illustrating other examples of the shape of etched middle portions on a top surface of a piezoelectric ceramic layer, according to an embodiment.

Middle portions on a top surface of a piezoelectric ceramic layer 410 may be etched in a half circle shape, as illustrated in FIG. 4, or middle portions on a top surface of a piezoelectric ceramic layer 510 may be etched in a rectangle shape, as illustrated in FIG. 5.

Figure 6:
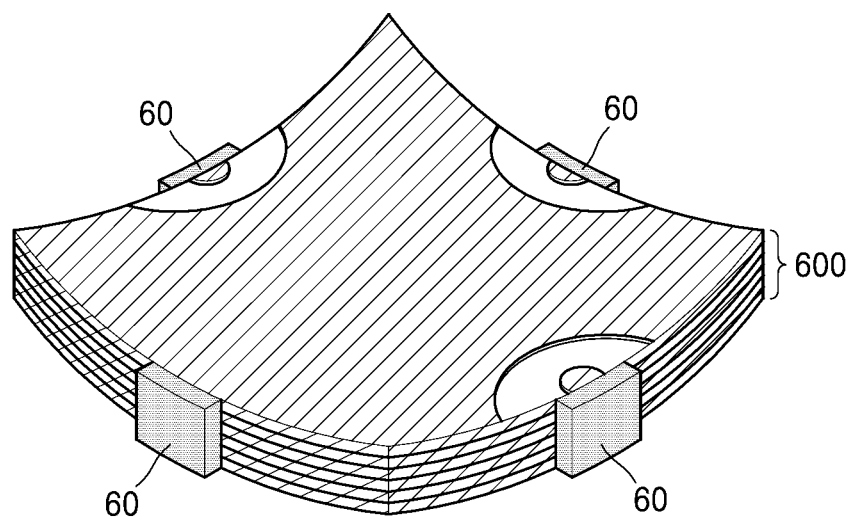
FIG. 6 is a view illustrating an example of transforming a plurality of stacked piezoelectric ceramic layers by applying a voltage thereto, according to an embodiment.

FIG. 6 is a view illustrating an example of transforming a plurality of stacked piezoelectric ceramic layers by applying a voltage thereto, according to an embodiment.

Referring to FIG. 6, because a plurality of electrodes 60 are connected along middle portions of external walls of a plurality of stacked piezoelectric ceramic layers 600, the plurality of stacked piezoelectric ceramic layers 600 may be flexibly transformed by an applied voltage. For example, vertices of the plurality of stacked piezoelectric ceramic layers 600 may also be flexibly transformed and thus a speaker may output high-quality sound and vibration by using the plurality of stacked piezoelectric ceramic layers 600 according to an embodiment. In addition, the speaker may have a high capacitance compared to the applied voltage by using the plurality of stacked piezoelectric ceramic layers 600 according to an embodiment.

When the plurality of electrodes 60 are connected along the middle portions of the external walls of the plurality of stacked piezoelectric ceramic layers 600, unlike a case when electrodes are connected to vertices of a plurality of stacked piezoelectric ceramic layers to apply a voltage, the vertices of the piezoelectric ceramic layers 600 may also be flexibly transformed and thus higher sound pressure may be generated.

Figure 7:
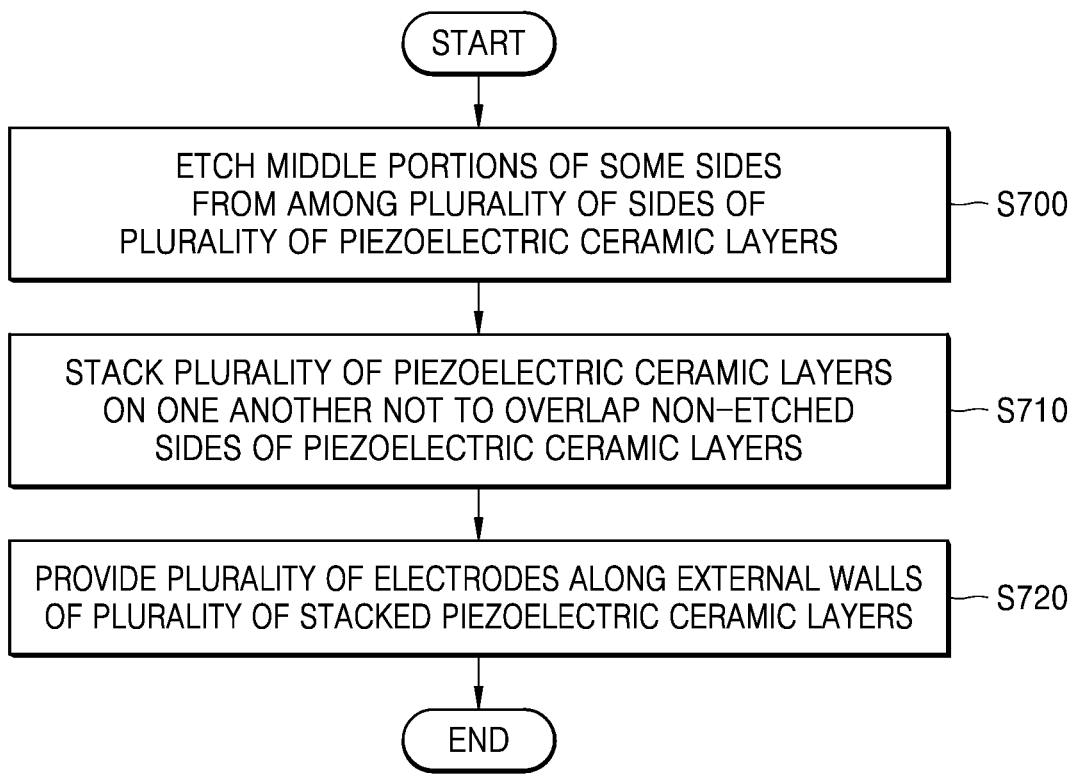
FIG. 7 is a flowchart of a method of manufacturing a piezoelectric element for a speaker, according to an embodiment.

FIG. 7 is a flowchart of a method of manufacturing a piezoelectric element for a speaker, according to an embodiment.

Operation S700 is an operation of etching middle portions of some sides from among a plurality of sides of each of a plurality of piezoelectric ceramic layers. For example, the piezoelectric ceramic layer 110 may be produced in a rectangle shape and middle portions of three sides from among four sides of the rectangle on a top surface of the piezoelectric ceramic layer 110 may be etched. In addition, a conductive material located on the middle portions of the some sides from among the plurality of sides on the top surface of the piezoelectric ceramic layer 110 may be etched. In this case, a width of the etched middle portions on the top surface of the piezoelectric ceramic layer 110 may be greater than a width of electrodes.

Operation S710 is an operation of stacking the plurality of piezoelectric ceramic layers on one another not to overlap non-etched sides of the piezoelectric ceramic layers. The plurality of piezoelectric ceramic layers may be stacked on one another in a thickness direction. For example, the plurality of piezoelectric ceramic layers may include the first to sixth piezoelectric ceramic layers 310, 320, 330, 340, 350, and 360, and the first to sixth piezoelectric ceramic layers 310, 320, 330, 340, 350, and 360 may be stacked on one another not to overlap non-etched middle portions thereof.

Operation S720 is an operation of providing a plurality of electrodes along external walls of the plurality of stacked piezoelectric ceramic layers. The plurality of electrodes may be provided to be connected to the middle portions of the sides of the plurality of piezoelectric ceramic layers along the external walls of the plurality of stacked piezoelectric ceramic layers. The plurality of electrodes may be provided in close contact with the plurality of piezoelectric ceramic layers along the external walls of the plurality of stacked piezoelectric ceramic layers. A width of the etched middle portions on a top surface of each of the plurality of piezoelectric ceramic layers may be greater than a width of electrodes, and a voltage from an electrode may be applied to each of the plurality of piezoelectric ceramic layers through the non-etched middle portion on the top surface of each of the plurality of piezoelectric ceramic layers.

Figure 8:
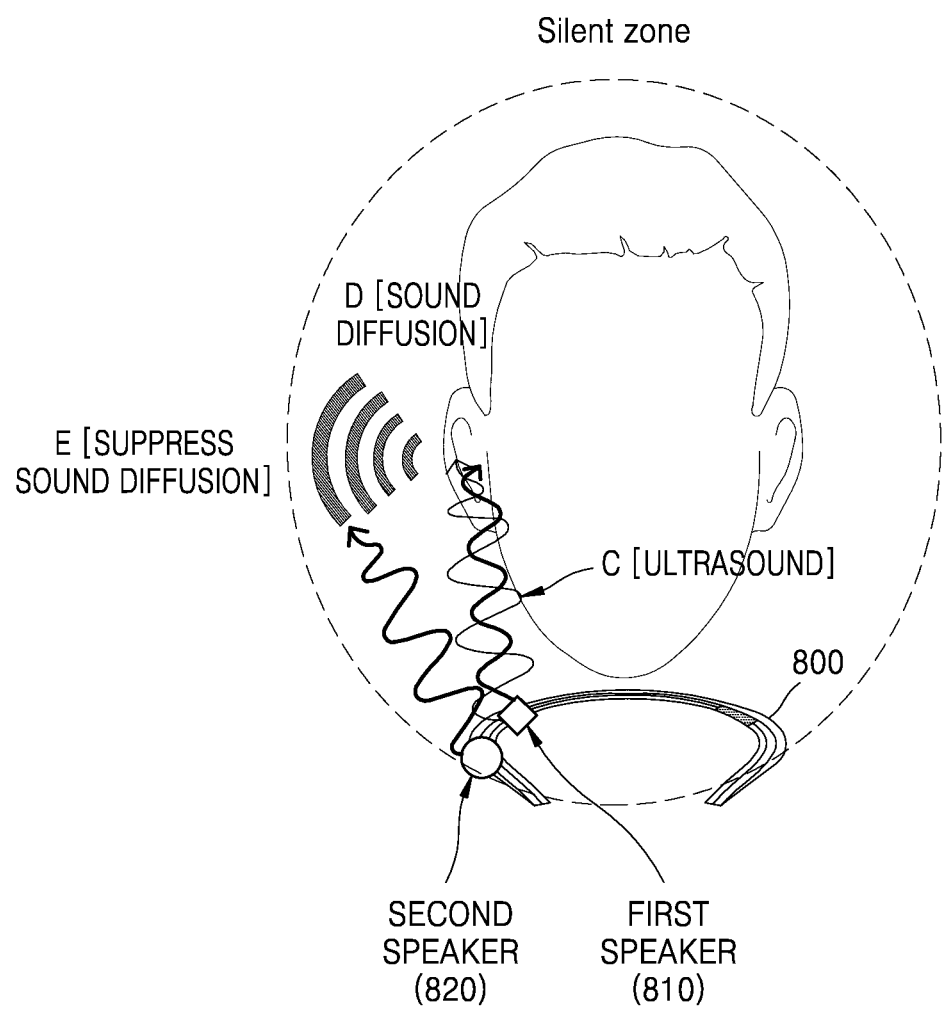
FIG. 8 is a view illustrating an example of preventing diffusion of sound by using a speaker including a piezoelectric element, according to an embodiment.

FIG. 8 is a view illustrating an example of preventing diffusion of sound by using a speaker including a piezoelectric element, according to an embodiment.

Referring to FIG. 8, a wearable speaker 800 may include a first speaker 810 and a second speaker 820. Sound may be output from the first speaker 810 of the wearable speaker 800, and the second speaker 820 may output antiphase sound of the output sound to prevent the output sound from being diffused around a user. The wearable speaker 800 may include, for example, a neckband speaker, but is not limited thereto.

The user may set an area for preventing diffusion of sound, and the second speaker 820 may output the antiphase sound, based on the user settings. The first and second speakers 810 and 820 may include the piezoelectric element described above in relation to FIGS. 1 to 7, but are not limited thereto.

Figure 9:
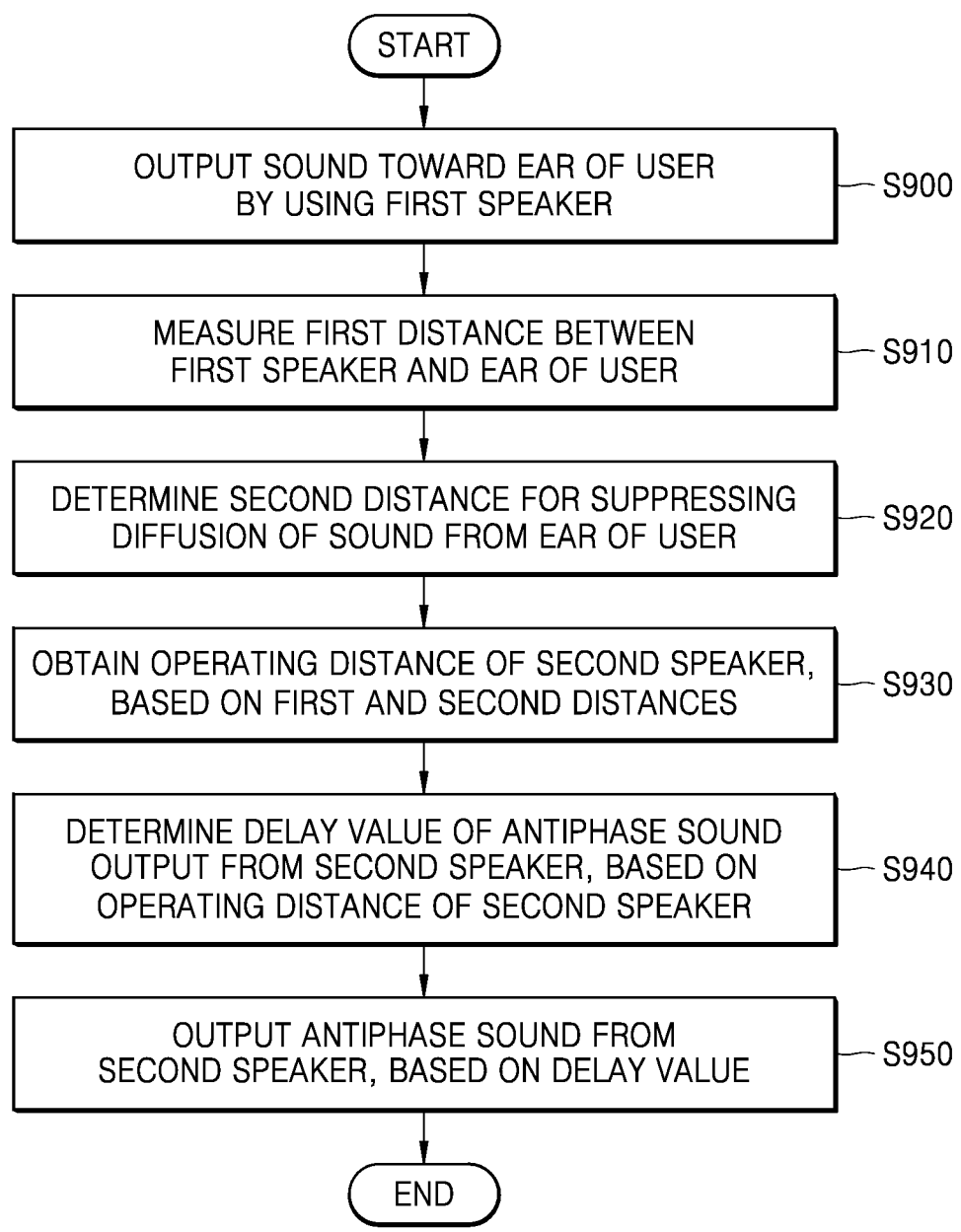
FIG. 9 is a flowchart of a method, performed by a wearable speaker 800, of suppressing diffusion of sound, according to an embodiment.

FIG. 9 is a flowchart of a method, performed by the wearable speaker 800, of suppressing diffusion of sound, according to an embodiment.

In operation S900, the wearable speaker 800 may output sound toward an ear of a user by using the first speaker 810. The output sound may be, for example, ultrasound, but is not limited thereto.

In operation S910, the wearable speaker 800 may measure a first distance between the first speaker 810 and the ear of the user. The first speaker 810 may output the sound toward the ear of the user and receive sound reflected from the ear of the user. The wearable speaker 800 may measure a time taken from when the sound is output toward the ear of the user until when the sound reflected from the ear of the user is received, and calculate the first distance between the ear of the user and the first speaker 810, based on the measured time. The wearable speaker 800 may calculate the first distance between the ear of the user and the first speaker 810 by multiplying a speed of the sound by the time taken from when the sound is output until when the reflected sound is received. The first distance between the ear of the user and the first speaker 810 may be repeatedly calculated in a preset cycle.

In operation S920, the wearable speaker 800 may determine a second distance for suppressing diffusion of sound from the ear of the user. The second distance for suppressing diffusion of sound from the ear of the user may be determined by the user. In this case, the user may set the second distance for suppressing diffusion of sound, by using a certain input means provided on the wearable speaker 800. Alternatively, the second distance for suppressing diffusion of sound from the ear of the user may be at least one default value set for the wearable speaker 800 when the wearable speaker 800 is manufactured.

In operation S930, the wearable speaker 800 may obtain an operating distance of the second speaker 820, based on the first and second distances. The wearable speaker 800 may calculate an angle between a sound diffusion direction of the first speaker 810 and a sound diffusion direction of the second speaker 820, based on the first and second distances.

In operation S940, the wearable speaker 800 may determine a delay value of antiphase sound output from the second speaker 820, based on the operating distance of the second speaker 820.

Figure 12:
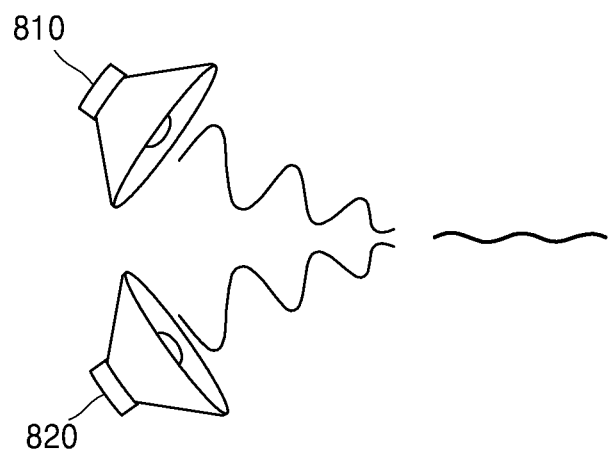
FIG. 12 is a view illustrating an example of canceling sound output and diffused from a first speaker, by using antiphase sound output from a second speaker.

In operation S950, the wearable speaker 800 may output the antiphase sound from the second speaker 820, based on the delay value of the antiphase sound. In this case, a sound output direction of the second speaker 820 may be physically adjusted based on the angle between the sound diffusion direction of the first speaker 810 and the sound diffusion direction of the second speaker 820, which is calculated in operation S930. The antiphase sound output from the second speaker 820 may cancel the sound output and diffused from the first speaker 810, as illustrated in FIG. 12.

Figure 10:
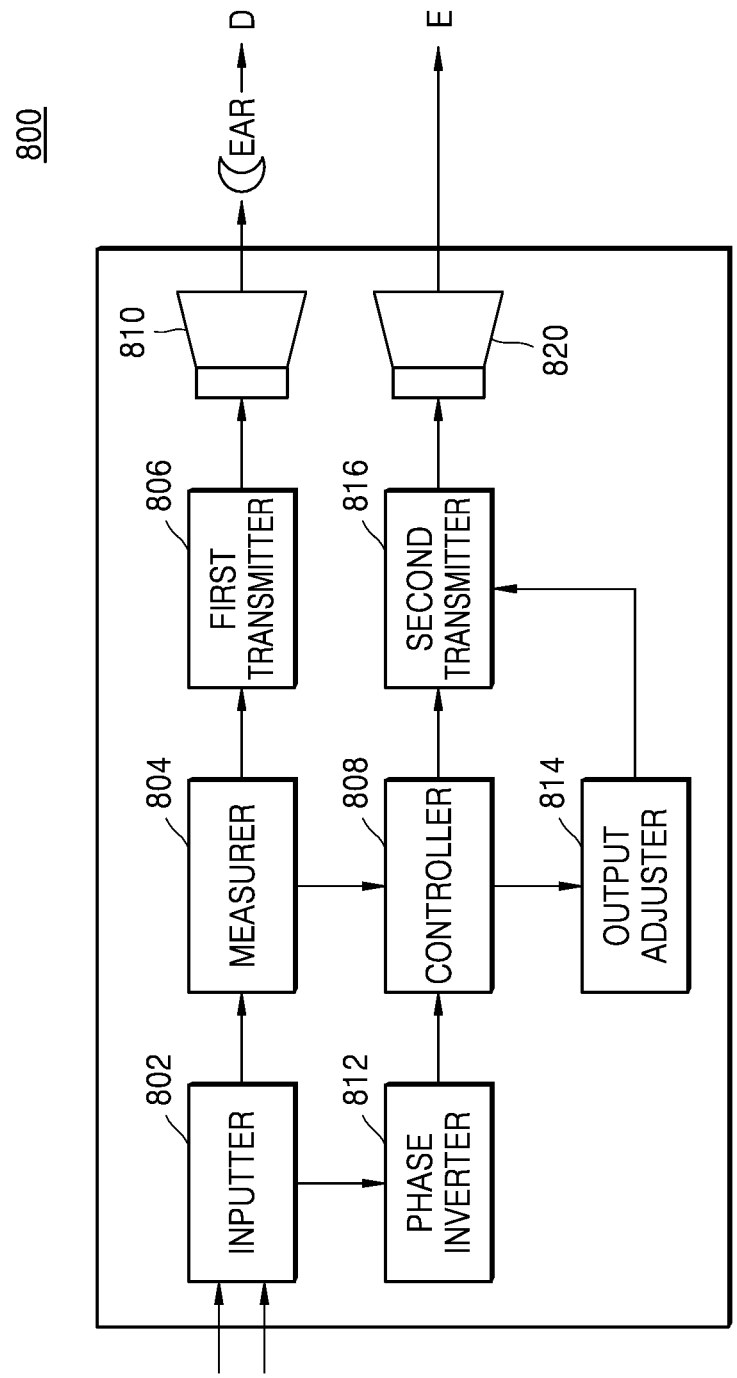
FIG. 10 is a block diagram of the wearable speaker 800 according to an embodiment.

FIG. 10 is a block diagram of the wearable speaker 800 according to an embodiment.

Referring to FIG. 10, the wearable speaker 800 may include an inputter 802, a measurer 804, a first transmitter 806, a controller 808, the first speaker 810, a phase inverter 812, an output adjuster 814, a second transmitter 816, and the second speaker 820.

The inputter 802 may receive data input to the wearable speaker 800. The inputter 802 may include at least one device capable of receiving, for example, a sound signal and an input signal of a user.

The measurer 804 may measure a first distance between an ear of the user and the first speaker 810. The first transmitter 806 may transmit the sound signal to the first speaker 810, and the phase inverter 812 may generate an antiphase sound signal of the input sound signal.

The controller 808 may determine a second distance for suppressing diffusion of sound from the ear of the user, based on the user input, and calculate an operating distance of the second speaker 820, based on the first and second distances. The controller 808 may control the output adjuster 814 to delay the antiphase sound to be output from the second speaker 820, based on the operating distance of the second speaker 820. The controller 808 may physically adjust a sound output direction of the second speaker 820, based on an angle between a sound diffusion direction of the first speaker 810 and a sound diffusion direction of the second speaker 820.

The output adjuster 814 may delay output of the antiphase sound, based on a delay value of the antiphase sound. The second transmitter 816 may transmit the delayed antiphase sound to the second speaker 820.

Figure 11:
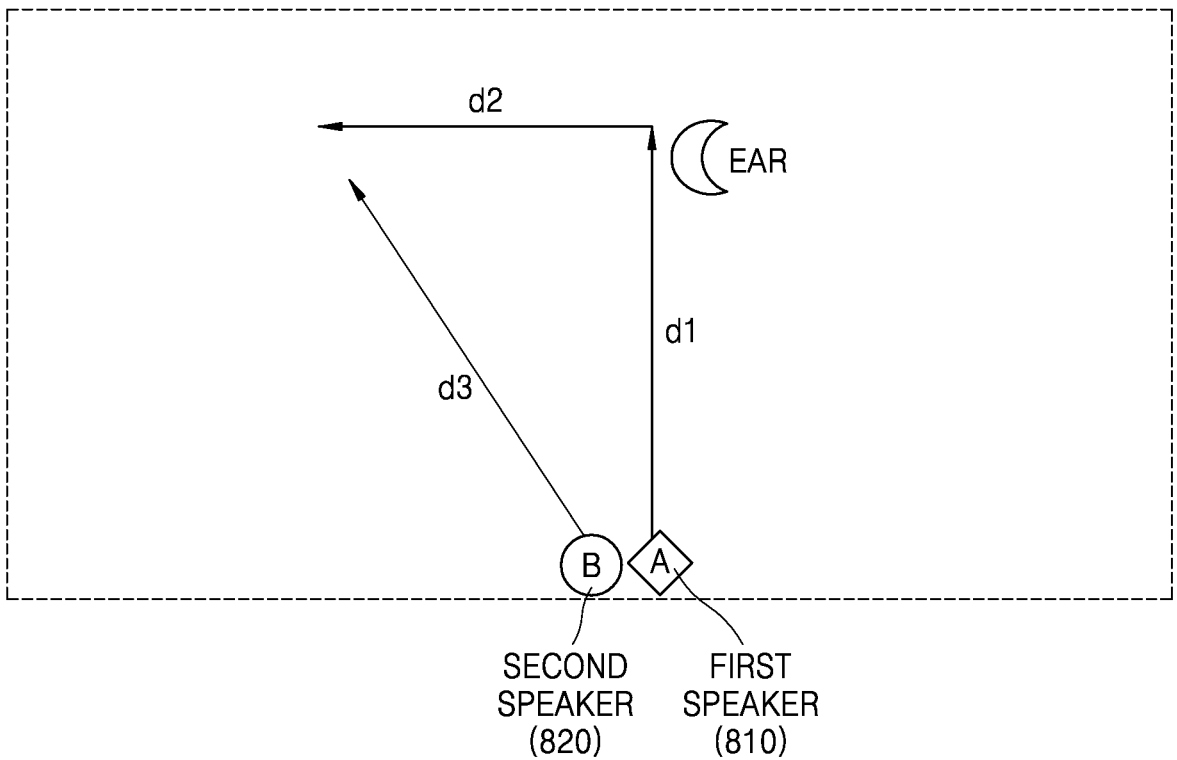
FIG. 11 is a view illustrating an example of calculating an operating distance of a second speaker, according to an embodiment.

FIG. 11 is a view illustrating an example of calculating an operating distance of a second speaker, according to an embodiment.

Referring to FIG. 11, a first distance from the first speaker 810 to an ear of a user may be d1, and a second distance for suppressing diffusion of sound from the ear of the user may be d2. An operating distance d3 of the second speaker 820 may be $(d1^2+d2^2)^{(1/2)}$. An angle between a sound output direction of the first speaker 810 and a sound output direction of the second speaker 820 may be calculated based on the first distance d1 from the first speaker 810 to the ear of the user and the second distance d2 for suppressing diffusion of sound from the ear of the user.

An embodiment of the disclosure may be implemented in the form of a computer-readable recording medium including instructions executable by a computer, e.g., a program module executed by a computer. The computer-readable recording medium may be an arbitrary available medium accessible by a computer, and examples thereof include all of volatile, non-volatile, detachable, and non-detachable media. The computer-readable recording medium may include a computer storage medium and a communication medium. Examples of the computer storage medium include all of volatile, non-volatile, detachable, and non-detachable media implemented using an arbitrary method or technology for storing information such as computer-readable instructions, data structures, program modules, or other data. The communication medium typically includes computer-readable instructions, data structures, program modules, other data in modulated data signals such as carrier waves, or another transport mechanism, and includes an arbitrary data transmission medium.

As used herein, a suffix "unit" or "—-er/or" may indicate a hardware component such as a processor or a circuit, and/or a software component executed by the hardware component such as the processor.

The above descriptions of the disclosure are provided for the purpose of illustration, and it will be understood by one of ordinary skill in the art that various changes in form and details may be made therein without departing from the scope of the disclosure. Therefore, it should be understood that embodiments of the disclosure described herein should be considered in a descriptive sense only and not for purposes of limitation. For example, each component described to be of a single type can be implemented in a distributed manner and, likewise, components described as being distributed can be implemented in a combined manner.

The scope of the disclosure is defined by the following claims rather than by the detailed description, and it should be understood that all modifications from the claims and their equivalents are included in the scope of the disclosure.

The invention claimed is:

1. A piezoelectric element for a speaker, the piezoelectric element comprising:
   a plurality of piezoelectric ceramic layers stacked on one another in a thickness direction; and
   a plurality of electrodes connected to middle portions of sides of the plurality of piezoelectric ceramic layers along external walls of the plurality of piezoelectric ceramic layers,
   wherein each piezoelectric ceramic layer in the plurality of piezoelectric ceramic layers comprises at least one recessed side and at least one non-recessed side among a plurality of sides of the piezoelectric ceramic layer, the at least one recessed side comprising a recessed portion disposed in a middle of the recessed side by etching, and the at least one non-recessed side having no recessed portion by etching, and
   wherein the plurality of piezoelectric ceramic layers are stacked on one another in the thickness direction such that non-recessed sides, of adjacently stacked piezoelectric ceramic layers in the plurality of piezoelectric ceramic layers, do not overlap in the thickness direction.

2. The piezoelectric element of claim 1, wherein directions that the non-recessed sides from among the plurality of sides face, are determined based on characteristics of the piezoelectric element.

3. The piezoelectric element of claim 1, wherein the plurality of piezoelectric ceramic layers are produced in a rectangle shape having four sides that form four external walls of the plurality of piezoelectric ceramic layers,
wherein the plurality of electrodes comprises four electrodes, and
wherein the four electrodes are disposed in contact with the four external walls of the plurality of piezoelectric ceramic layers along a middle of the four external walls, respectively.

4. The piezoelectric element of claim 1, wherein a width of the recessed portion is greater than a width of one of the plurality of electrodes.

5. The piezoelectric element of claim 1, wherein the recessed portion is formed by etching a top surface of one of the plurality of piezoelectric ceramic layers.

6. The piezoelectric element of claim 5, wherein a shape and a size of the recessed portion are determined based on characteristics of the piezoelectric element.

7. The piezoelectric element of claim 5, wherein the recessed portion is formed by etching the top surface of the one of the plurality of piezoelectric ceramic layers to form a recessed half circle shape or a recessed half oval shape.

8. The piezoelectric element of claim 5, wherein the recessed portion is formed by etching the top surface of the one of the plurality of piezoelectric ceramic layers to form a recessed half donut shape.

9. The piezoelectric element of claim 1, wherein the plurality of piezoelectric ceramic layers comprise at least four piezoelectric ceramic layers stacked on one another.

10. A method of manufacturing a piezoelectric element for a speaker, the method comprising:
for each of a plurality of piezoelectric ceramic layers, etching a middle portion of a recessed side to form a recessed portion, and not etching a middle portion of a non-recessed side;
stacking the plurality of piezoelectric ceramic layers on one another in a thickness direction such that the non-recessed sides of adjacently stacked piezoelectric ceramic layers do not overlap in the thickness direction; and
providing a plurality of electrodes connected to the middle portions of the recessed sides and the non-recessed sides of the plurality of piezoelectric ceramic layers along external walls of the plurality of stacked piezoelectric ceramic layers when stacked.

11. The method of claim 10, wherein directions that the non-recessed sides face are determined based on characteristics of the piezoelectric element.

12. The method of claim 10, wherein the plurality of piezoelectric ceramic layers are produced in a rectangle shape having four sides that form four external walls of the plurality of piezoelectric ceramic layers when stacked,
wherein the plurality of electrodes comprises four electrodes, and
wherein the providing of the plurality of electrodes comprises providing the four electrodes respectively in contact with the four external walls of the plurality of piezoelectric ceramic layers along a middle of the four external walls.

* * * * *